(12) United States Patent
Koo et al.

(10) Patent No.: US 7,256,534 B2
(45) Date of Patent: Aug. 14, 2007

(54) FLAT PANEL DISPLAY WITH BLACK MATRIX

(75) Inventors: Jae-Bon Koo, Yongin (KR); Dong-Chan Shin, Hwaseong (KR)

(73) Assignee: Samsung SDI Co., Ltd., Suwon-si (KR)

( * ) Notice: Subject to any disclaimer, the term of this patent is extended or adjusted under 35 U.S.C. 154(b) by 208 days.

(21) Appl. No.: 10/288,509

(22) Filed: Nov. 6, 2002

(65) Prior Publication Data

US 2003/0117059 A1 Jun. 26, 2003

(30) Foreign Application Priority Data

Dec. 26, 2001 (KR) .................. 2001-85187

(51) Int. Cl.
- H01J 1/46 (2006.01)
- H01J 9/20 (2006.01)
- H01L 29/04 (2006.01)
- H01L 29/22 (2006.01)

(52) U.S. Cl. .................. 313/306; 257/40; 257/59; 257/72; 257/98; 445/24

(58) Field of Classification Search ............ 315/169.1, 315/169.3, 169.4; 313/506, 306, 311; 257/40, 257/59, 72, 98; 445/24; 349/43, 44
See application file for complete search history.

(56) References Cited

U.S. PATENT DOCUMENTS

| | | | |
|---|---|---|---|
| 5,777,701 A * | 7/1998 | Zhang | 349/44 |
| 6,002,463 A * | 12/1999 | Fujikawa | 349/110 |
| 6,236,063 B1 * | 5/2001 | Yamazaki et al. | 257/59 |
| 6,262,436 B1 * | 7/2001 | Nakata | 257/59 |
| 6,300,152 B1 * | 10/2001 | Kim | 438/30 |
| 6,532,050 B1 * | 3/2003 | Kim et al. | 349/106 |
| 6,570,631 B2 * | 5/2003 | Ko | 349/43 |
| 6,583,439 B2 * | 6/2003 | Yamazaki et al. | 257/59 |
| 6,674,495 B1 * | 1/2004 | Hong et al. | 349/43 |
| 6,955,578 B2 * | 10/2005 | Park et al. | 445/3 |
| 2001/0048490 A1 * | 12/2001 | Lim et al. | 349/44 |
| 2002/0038998 A1 * | 4/2002 | Fujita et al. | 313/495 |
| 2003/0128311 A1 * | 7/2003 | Tsuda et al. | 349/106 |

FOREIGN PATENT DOCUMENTS

| | | |
|---|---|---|
| JP | 8-122769 | 5/1996 |
| KR | 10-177050 | 11/1998 |
| KR | 2002-33078 | 5/2002 |

OTHER PUBLICATIONS

U.S. Appl. No. 10/288,486, filed Nov. 6, 2002, Jae-Bon Koo et al.
Office Action issued in Korean Patent Application No. 2001-85187 on Jul. 14, 2004.

* cited by examiner

*Primary Examiner*—Thuy Vinh Tran
(74) *Attorney, Agent, or Firm*—Stein, McEwen & Bui, LLP

(57) ABSTRACT

A flat panel display has an insulating substrate at the upper part of which a pixel electrode is equipped; an opaque conductive film formed on the front surface of the insulating substrate except at the pixel electrode; an insulating film equipped with a contact hole exposing a portion of the opaque conductive film; and a thin film transistor equipped with a gate electrode, and conductive patterns for source/drain electrodes connected to the opaque conductive film through the contact hole.

29 Claims, 7 Drawing Sheets

FLAT PANEL DISPLAY WITH BLACK MATRIX

CROSS-REFERENCE TO RELATED APPLICATIONS

This application claims the benefit of Korean Application No. 2001-85187, filed Dec. 26, 2001, in the Korean Industrial Property Office, the disclosure of which is incorporated herein by reference.

BACKGROUND OF THE INVENTION

1. Field of the Invention

The present invention relates to a flat panel display and a method of fabricating the same, and more particularly, to a rear light emitting type organic electroluminescent display with a black matrix and a method of fabricating the same.

2. Description of Related Art

FIG. 1A illustrates the cross sectional structure of a conventional organic electroluminescent display. FIG. 1B illustrates a plan view of a conventional organic electroluminescent display, wherein FIG. 1A is a cross sectional structure taken along the line I-I of FIG. 1B.

Referring to FIG. 1A, a transparent insulating substrate 10 on the upper part of which a buffer layer 15 is formed is divided into a first region 11 in which a pixel electrode is formed and a second region 12 in which a thin film transistor (TFT) and a capacitor are formed. A thin film transistor equipped with a semiconductor layer 20 in which source/drain regions 21, 22 are formed, a gate electrode 31 and source/drain electrodes 51, 52 respectively connected to the source/drain regions 21, 22 through contact holes 41, 42, is formed in the second region 12 of the insulating substrate 10. Furthermore, a capacitor, equipped with a first electrode 32 and a second electrode 53, is formed in the second region 12, and an insulating film, that is, a gate insulating film 30 and an interlayer insulating film 40 are formed between the conductive layers.

In the first region 11, one of the source/drain electrodes 51, 52 is connected to a pixel electrode 70 through a via hole 61 formed on a protection film 60 and acting as an anode electrode while a flattening film 80, equipped with an opening part 81 exposing a portion of the pixel electrode 70, is formed on the protection film 60 comprising the pixel electrode 70. An organic electroluminescent (EL) layer 90 is formed in the opening part 81, and a rear light emitting opaque electrode, namely, a cathode electrode 95, is formed on the organic EL layer 90.

Referring to FIG. 1B, the organic electroluminescent display is equipped with a plurality of signal lines, i.e., gate lines 35 used in selecting pixels and data lines 55 impressing data signals and power supply lines 56 providing a reference voltage required in driving a thin film transistor by impressing an equal common voltage to all pixels.

Pixels are respectively arranged per each pixel region limited by the signal lines 35, 55, 56, wherein each of the pixels comprises a plurality of thin film transistors connected to the signal lines, for example, two transistors, one capacitor and an organic electroluminescent display.

A flat panel display device, such as an active matrix organic light emitting device (AMOLED), comprises various wirings to impress a power supply to the switching device, wherein greatly reduced contrast of the flat panel display device is greatly reduced since an external light is reflected by a metallic material providing wirings. That is, there have been problems in that contrast is reduced since the external light is reflected by a gate electrode material acting as a lower electrode of the capacitor, and source/drain electrode materials comprising an upper electrode of the capacitor and a cathode material comprising a cathode, etc., as illustrated in FIG. 1A and FIG. 1B.

Although deterioration of contrast of a flat panel display device due to reflection of the external light has been conventionally prevented by attaching an expensive polarizer to the front surface of the flat panel display device, there have been other occurring problems that have arisen. Some of these problems are that manufacturing costs have increased according to use of the expensive polarizer and deterioration of luminescence of the flat panel display device since the polarizer itself blocks a portion of light emitted from an organic electroluminescent layer, thereby reducing transmittance of the light.

Furthermore, there have been problems in that although the signal lines should be formed so that two signal lines are electrically separated from each other on one layer, as illustrated in FIG. 1B, an inline short (59) is generated between lines each of which are adjacently arranged by conductive particles generated during processing, e.g., between the data lines (55) and the power supply lines (56), resulting in the formation of line defects.

SUMMARY OF THE INVENTION

Accordingly, it is an object of the present invention to provide a flat panel display and a fabrication method of the same in which contrast is increased and costs are lowered by preventing reflection of an external light using a black matrix.

It is another object of the present invention to provide a flat panel display and a fabrication method of the same in which formation of inline shorts and loss of a power voltage are prevented using a black matrix as a common power line.

It is another object of the present invention to provide a flat panel display and a fabrication method of the same in which capacitance is increased by using a black matrix as a capacitor electrode.

Additional objects and advantages of the invention will be set forth in part in the description which follows and, in part, will be obvious from the description, or may be learned by practice of the invention.

The foregoing and other objects of the present invention are achieved by providing a flat panel display comprising: an insulating substrate; a pixel electrode formed over the insulating substrate; and a black matrix formed on the front surface of the the insulating substrate except for a part on which the pixel electrode is formed.

The foregoing and other objects of the present invention may also be achieved by providing a flat panel display comprising: an insulating substrate; a pixel electrode formed over the insulating substrate; an opaque conductive film formed on the front surface of the insulating substrate except at the pixel electrode and acting as a black matrix and a power supply line; an insulating film equipped with contact holes exposing a portion of the opaque conductive film; and a thin film transistor equipped with a gate electrode, and conductive patterns for source/drain electrodes connected to the opaque conductive film through the contact holes.

The black matrix comprises a metallic material having a low reflectivity consisting of Mo or Cr, or an opaque insulating material consisting of CrOx or MoOx.

Furthermore, the black matrix has a gradual concentration gradient by comprising a first transparent component and a second metallic component, and the black matrix comprises a film in which the deeper an incidence depth of an external light is, the more the second metallic component is increased while the more the first transparent component is reduced according to a deposition thickness of the black matrix, wherein the first transparent component comprises a transparent insulating material consisting of $SiO_2$ or $SiNx$, or a transparent conductive material consisting of ITO, IZO or ZnO, and the second metallic component consists of one of Al, Cr, Mo, W, Ti, Ag and Cu.

Furthermore, the present invention provides a method of fabricating a flat panel display with a pixel electrode comprising: forming a black matrix on the front surface of the insulating substrate except at the pixel electrode; forming a first insulating film on the front surface of the insulating substrate including the black matrix; forming a gate electrode on the upper part of the first insulating film; forming a second insulating film on the front surface of the insulating substrate; forming a contact hole exposing a portion of the black matrix by etching the first and second insulating films; and forming source/drain electrodes connected to the black matrix through the contact hole.

BRIEF DESCRIPTION OF THE DRAWINGS

These and other objects and advantages of the invention will become apparent and more readily appreciated from the following description of the embodiments, taken in conjunction with the accompanying drawings of which.

DETAILED DESCRIPTION OF THE INVENTION

Figure 1A:
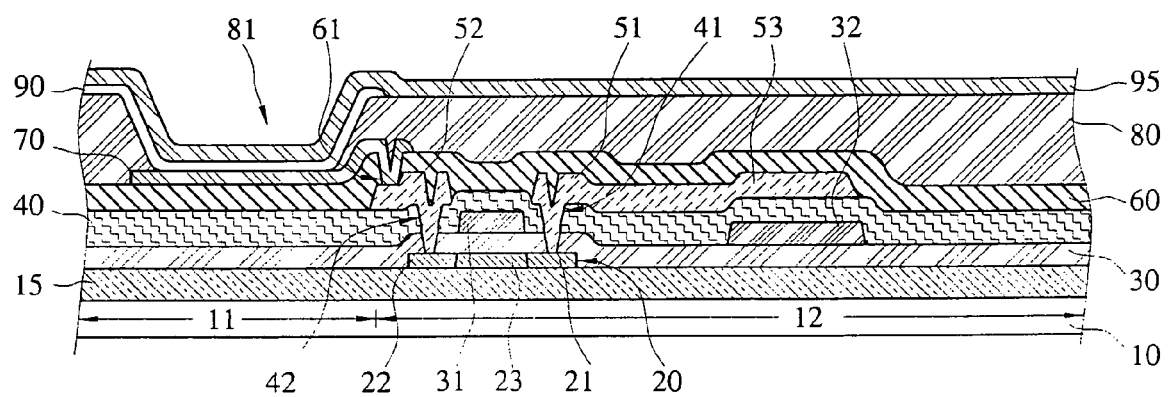
FIG. 1A is a sectional view of a conventional organic electroluminescent display.
Figure 1B:
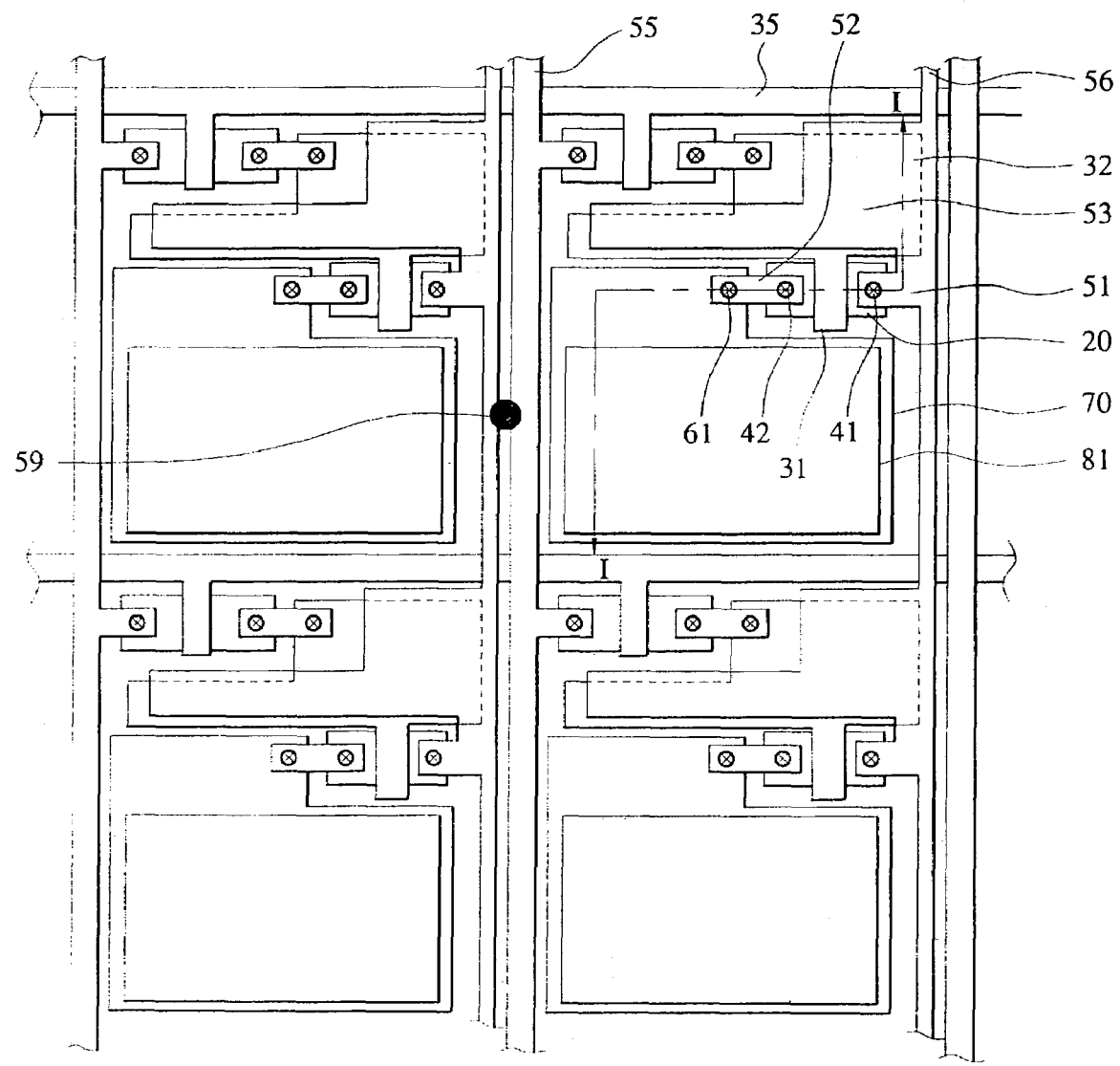
FIG. 1B is a plan view of a conventional organic electroluminescent display.

Reference will now be made in detail to the embodiments of the present invention, examples of which are illustrated in the accompanying drawings, wherein like reference numerals refer to like elements throughout. The embodiments are described below in order to explain the present invention by referring to the figures.

Figure 2A:
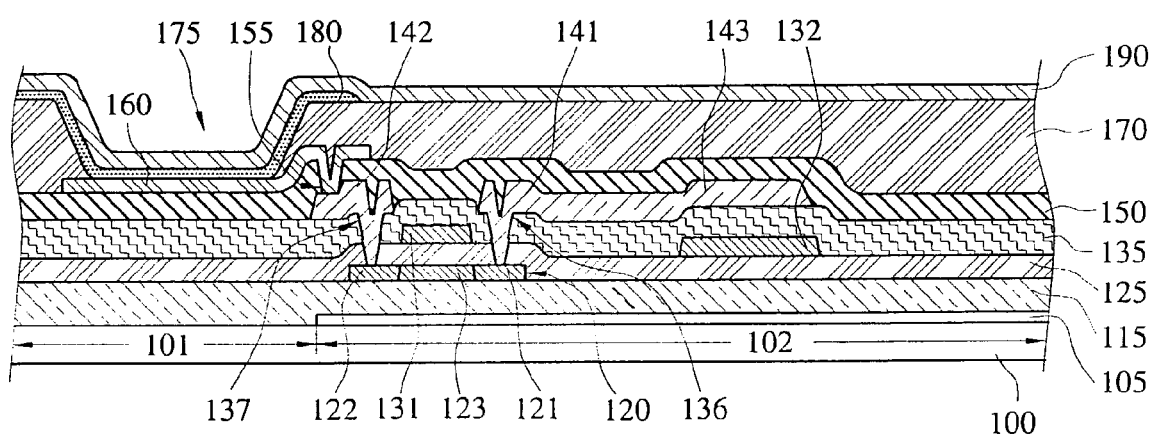
FIG. 2A is a sectional view of an organic electroluminescent display according to an embodiment of the present invention.
Figure 2B:
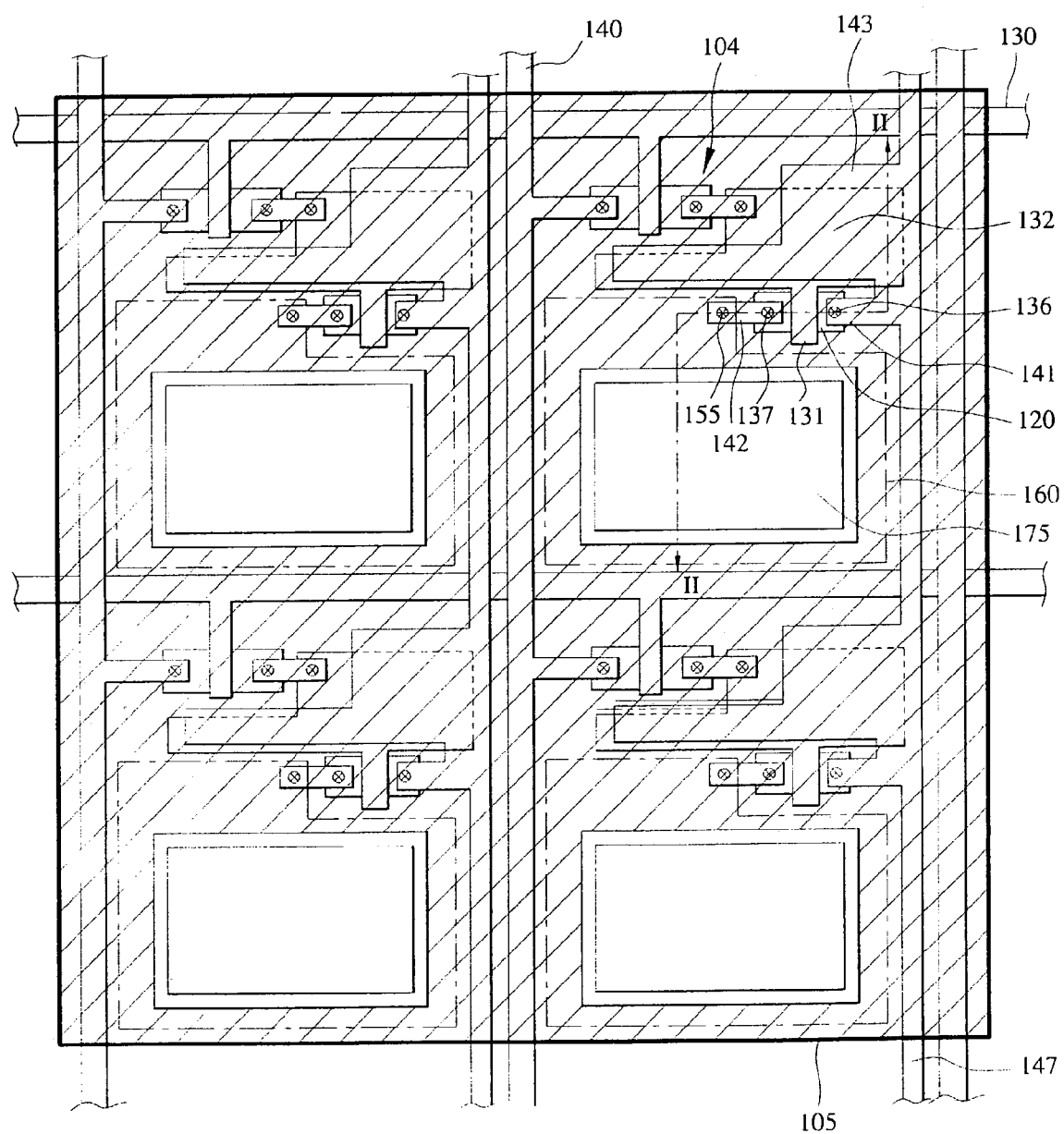
FIG. 2B is a plan view of an organic electroluminescent display according to the embodiment of FIG. 2A.

FIG. 2A illustrates the cross sectional structure of a rear light emitting type organic electroluminescent display according to an embodiment of the present invention, and FIG. 2B illustrates the cross sectional structure taken along a line II-II of FIG. 2A in which the cross sectional structure is illustrated while being limited to one pixel, that is, one pixel region 104.

Referring to FIG. 2A and FIG. 2B, a substrate 100 is provided with a first region 101 in which a pixel electrode is to be formed and a second region 102 in which a TFT and a capacitor are to be formed.

A black matrix 105 is formed on the substrate 100 except at the first region 101 in which the pixel electrode is to be formed. The black matrix 105 is formed on the front surface of the substrate 100 so that only an opening part 175 of a pixel region 104 which is limited by a plurality of signal lines, namely, a gate line 130, a data line 140 and a power supply line 147 is exposed.

The black matrix 105 comprises an opaque material so as to prevent reflection of an external light. A metallic material having a relatively low reflectivity such as Cr or Mo, or an opaque insulating material such as CrOx or MoOx is used as a material for the black matrix 105. Furthermore, an organic material, for example acryl, polyimide, phenol, etc., comprising a pigment of carbon black can be used as a material for the black matrix 105.

Figure 4:
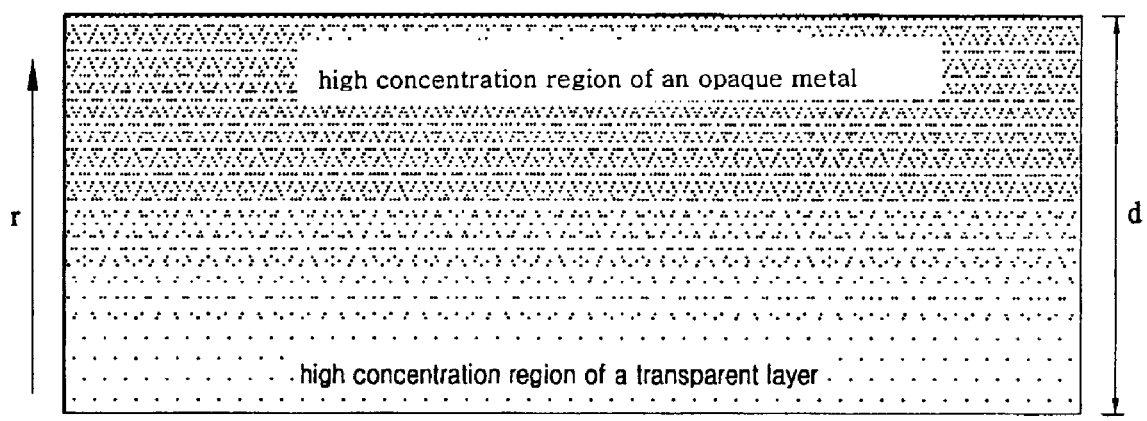
FIG. 4 is a drawing illustrating characteristics of a concentration gradient of a black matrix of an organic electroluminescent display according to the embodiments of the present invention.

Furthermore, a film can be formed which has a gradual concentration gradient by comprising a first transparent component and a second metallic component as illustrated in FIG. 4 as a material for the black matrix 105. The first transparent component of the film having the concentration gradient for the black matrix 105 comprises a transparent insulating material consisting of $SiO_2$ or $SiNx$, or a transparent conductive material consisting of one of ITO, IZO and ZnO, and the second metallic component comprises a metallic material consisting of one of Al, Cr, Mo, W, Ti, Ag and Cu. The film having the concentration gradient is formed by simultaneously depositing the first and second components in a co-sputtering or co-evaporation method.

FIG. 4 illustrates characteristics of a concentration gradient of a black matrix 105 of the present invention, wherein the black matrix 105 is deposited in such a manner that a metallic material is gradually increased, and a transparent material is gradually reduced according to a deposition thickness (d) of the black matrix. That is, the transparent material is distributed so that the deeper an incidence depth (r) is in an incidence direction of the external light, the more its composition is gradually reduced while the metallic material is distributed so that the deeper an incidence depth (r) is in an incidence direction of the external light, the more its composition is gradually increased, wherein the transparent and metallic materials almost equally exist in the region of about ½ deposition thickness of a film.

Therefore, since a distribution of reciprocal inversely proportional composition ratios of the transparent and metallic materials is gradually and slowly changed in the film having a concentration gradient, the reflection of an external light is suppressed not by reflection but by absorption of an incident external light so that the film with the concentration gradient functions as a black matrix to prevent the reflection of the external light accordingly.

A buffer layer 115 is formed on the substrate 100 comprising the black matrix 105, and a thin film transistor is formed in the second region 102, the thin film transistor comprises a semiconductor layer 120 in which source/drain regions 121, 122 are formed, a gate electrode 131 is formed on a gate insulating film 125 and source/drain electrodes 141, 142 are formed on an interlayer insulating film 135 so that they respectively contact the source/drain regions 121, 122 through contact holes 136, 137.

Furthermore, a capacitor is formed on a second region 102, wherein the capacitor is equipped with a first electrode 132 that comprises the same material as the gate electrode 131 and a second electrode 143 that is connected to one of the source/drain electrodes, e.g., the source/drain electrodes 141, 142. A part between the first electrode 132 and the second electrode 143 of the capacitor functions as a capacitor dielectric film.

A pixel electrode 160 is formed in the first region 101, wherein the pixel electrode 160 contacts, through a protection film 150 and a via hole 155, one of the source/drain electrodes 141, 142, e.g., the drain electrode 142 as illustrated in FIG. 2A.

A flattening film 170 equipped with an opening part 175 exposing the pixel electrode 160 is formed on the protection film 150, and an organic electroluminescent layer 180 and a cathode electrode 190 are formed on the flattening film 170.

In the foregoing organic electroluminescent display according this embodiment, a black matrix 105 is formed on the front surface of a substrate except at an opening part exposing the pixel electrode 160 so that reflection of an external light by metallic wirings, such as gate and source/drain electrodes, is prevented.

Figure 3A:
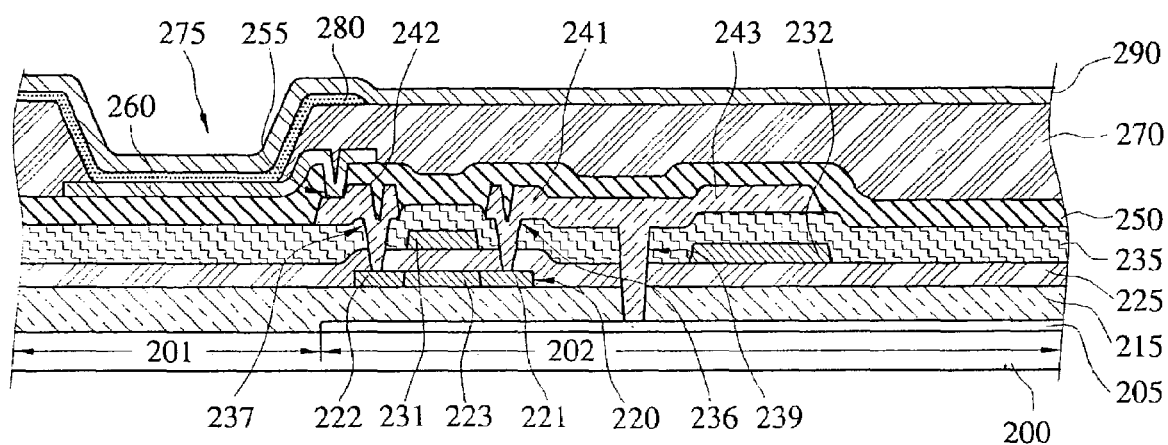
FIG. 3A is a sectional view of an organic electroluminescent display according to another embodiment of the present invention.
Figure 3B:
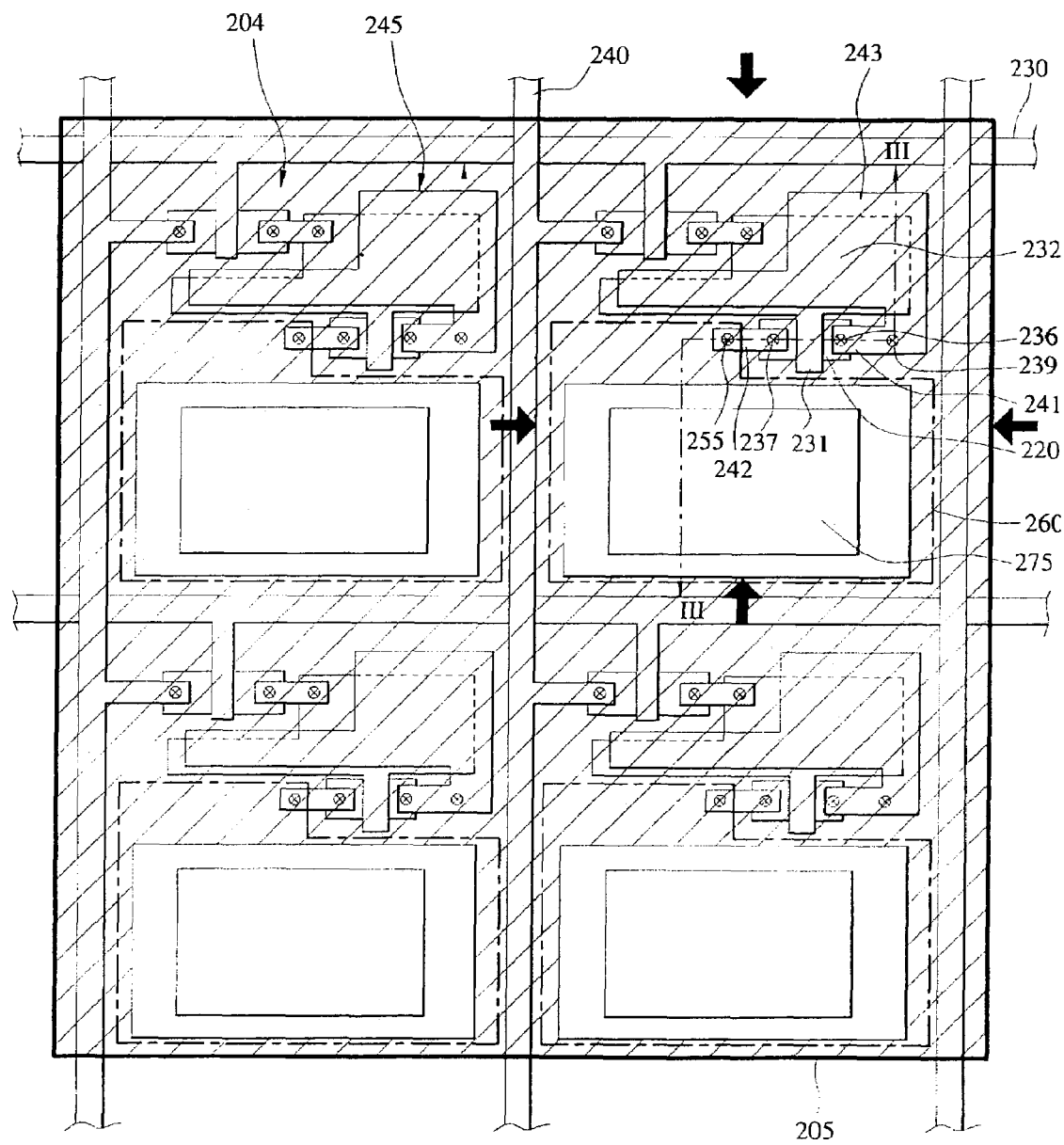
FIG. 3B is a plan view of an organic electroluminescent display according to the embodiment of FIG. 3A.

FIG. 3A illustrates a sectional view of an organic electroluminescent display according to another embodiment of the present invention, while FIG. 3B illustrates a plan view of an organic electroluminescent display according to the embodiment of FIG. 3A. FIG. 3A illustrates one pixel, namely, one pixel region 204 as the cross sectional structure taken along the line III-III of FIG. 3B. Each pixel comprises an organic electroluminescent display equipped with, for example, two thin film transistors, one capacitor and a pixel electrode 260.

An organic electroluminescent display according to this embodiment has a structure in which a black matrix is adopted as a power supply line as well as an optical reflection protection film by forming the black matrix with a conductive material, while other parts of this embodiment are the same as in the above described embodiment. Here, an opaque conductive film 205 is formed in a second region 202 of an insulating substrate 200 on which a thin film transistor and a capacitor are formed except at a first region 201 where a pixel electrode 260 is formed. That is, the opaque conductive film 205 is formed on the front surface of the substrate so that the pixel electrode 260 formed in the first region 201 is exposed through an opening part 275.

Since an opaque conductive film 205 formed on the front surface of the substrate also performs a function of a power supply line, the opaque conductive film 205 should be connected to thin film transistors and capacitors formed per pixel regions 204 limited by gate lines 230 and data lines 240. Therefore, the contact holes 239 are formed per each of the pixel regions 204 so that the opaque conductive film 205 is connected to the thin film transistors and the capacitors of each of the pixels through the contact holes 239. That is, an island shaped conductive pattern 245 which acts as a second electrode 243 of the capacitor and a source electrode 241 of the thin film transistor per each pixel region 204 is connected to the opaque conductive film 205 that plays a role of the power supply line through the contact hole 239.

Therefore, since the opaque conductive film 205 not only prevents reflection of an external light, but also is electrically connected to one of the source/drain electrodes 241, 242 of the thin film transistor, e.g., the source electrode through the contact hole 239, a power voltage (Vdd) commonly impressed to each pixel is impressed from the opaque conductive film 205 to the source electrode 241, while the opaque conductive film 205 of a metallic material having a low reflectivity such as Cr and Mo is used, or a deposited film is used by depositing a film with a concentration gradient of a transparent conductive material and a metallic material in a co-sputtering or co-evaporation method as illustrated in FIG. 4.

A black matrix 205 not only plays a role of a power supply line, but also functions as an electrode of a capacitor in another embodiment of the present invention. Not only in-line shorts between neighboring signal lines are prevented by using the black matrix 205 as a power supply line, but also dropping of a voltage is prevented by impressing a common power voltage in four directions (an arrow direction of FIG. 3B) and forming the power supply line not in a line shape but in the front surface structure.

Furthermore, an organic electroluminescent display according to this embodiment comprises a first capacitor including a black matrix 205, a first electrode 232 and two dielectric films formed as a buffer insulating film 215 and a gate insulating film 225 between the black matrix 205 and the first electrode 232, and a second capacitor including a first electrode 232, a second electrode 243 and a dielectric film formed as an interlayer insulating film 235 between the first electrode 232 and the second electrode 243 so that the black matrix 205 is connected to the second electrode 243 through a contact hole 239 in a parallel circuit, thereby increasing a capacitance and an opening ratio accordingly.

Furthermore, although the embodiments of the present invention are explained with limitation to a rear light emitting type organic electroluminescent display, the present invention can be applied to an active matrix liquid crystal display device.

Not only deterioration of contrast by reflection of an external light is prevented by forming a black matrix on the front surface of a substrate except at a pixel region, but forming a black matrix on the front surface of a substrate also accomplishes an overall increase of luminance and lowering of cost by not using an expensive polarizer.

Furthermore, by using a black matrix as a power supply line, not only in-line shorts between neighboring signal lines are prevented, but also dropping of a voltage can be prevented.

In addition, the present invention has advantages in that a capacitance is increased, and an opening ratio is increased accordingly by providing a structure in which two capacitors are connected in a parallel circuit using a black matrix as an electrode of the capacitors.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A flat panel display comprising:
   a transparent insulating substrate;
   at least one of source and drain electrodes formed over the transparent insulating substrate;
   a protection film formed over the at least one of source and drain electrodes and including a hole;
   a pixel electrode formed over the protection film; and
   a black matrix formed between a front surface of the transparent insulating substrate and a portion of a rear surface of the pixel electrode where the pixel electrode contacts one of the source and drain electrodes through the hole formed in the protection film.

2. The flat panel display according to claim 1, wherein the black matrix consists of Mo or Cr as a metallic material having a low reflexibility.

3. The flat panel display according to claim 1, wherein the black matrix consists of CrOx or MoOx as an opaque insulating material.

4. The flat panel display according to claim 1, wherein the black matrix has a gradual concentration gradient by comprising a first transparent component and a second metallic component, and the black matrix comprises a film in which the deeper an incidence depth of an external light is, the more the second metallic component is increased while the more the first transparent component is reduced according to a deposition thickness of the black matrix.

5. The flat panel display according to claim 4, wherein the first transparent component comprises a transparent insulating material consisting of one of $SiO_2$ or $SiNx$, or a transparent conductive material consisting of one of ITO, IZO and ZnO, and the second metallic component consisting of one of Al, Cr, Mo, W, Ti, Ag and Cu.

6. The flat panel according to claim 5, wherein the film having the concentration gradient is formed by simultaneously depositing the first and second components in a co-sputtering or co-evaporation method.

7. The flat panel display according to claim 1, wherein the black matrix is formed of an organic material comprising a carbon black.

8. The flat panel display according to claim 1, wherein the flat panel display is fabricated by a method comprising:
   forming the black matrix on the front surface of the insulating substrate except at the pixel electrode;
   forming a first insulating film on the front surface of the insulating substrate including the black matrix;
   forming a gate electrode on an upper part of the first insulating film;
   forming a second insulating film on the front surface of the insulating substrate;
   forming a contact hole exposing a portion of the black matrix by etching the first and second insulating films; and
   forming source/drain electrodes connected to the black matrix through the contact hole.

9. The flat panel display according to claim 8, wherein the black matrix acts as a power supply line so that a common power voltage is supplied to the source/drain electrodes through contact holes.

10. The flat panel display according to claim 8, wherein the black matrix comprises a metallic material having a low reflectivity.

11. The flat panel display according to claim 8, wherein the black matrix has a gradual concentration gradient by consisting of a transparent conductive material and a metallic material, and the black matrix consists of a film in which the deeper an incidence depth of an external light is, the more the metallic material is increased while the more the transparent conductive material is reduced according to a deposition thickness of the black matrix.

12. The flat panel display according to claim 11, wherein the black matrix is formed by depositing the transparent conductive material of one of ITO, IZO and Zn, and the metallic material of one of Al, Cr, Mo, W, Ti, Ag and Cu at the same time.

13. The flat panel display according to claim 12, wherein the film having the concentration gradient is formed by simultaneously depositing the first and second components in a co-sputtering or co-evaporation method.

14. The flat panel display according to claim 13, wherein the black matrix is deposited such that the metallic material is gradually increased, and the transparent material is gradually reduced according to a deposition thickness of the black matrix.

15. The flat panel display according to claim 14, wherein the distribution of reciprocal inversely proportional composition ratios of the transparent and metallic materials is gradually and slowly changed such that the reflection of incident light is suppressed by absorption.

16. The flat panel according to claim 1, wherein the black matrix is formed of an organic material comprising a pigment of carbon black.

17. The flat panel according to claim 16, wherein the organic material is one of acryl, polyimide and phenol.

18. The flat panel display according to claim 1, wherein the flat panel display is manufactured by a method comprising:
   forming the black matrix on the insulating substrate except at a region in which a pixel is to be formed such that only the opening part of the pixel region which is limited by a plurality of signal lines is exposed.

19. The flat panel display according to claim 18, wherein the signal lines include a gate line, a data line and a power supply line.

20. The method according to claim 19, wherein the black matrix is formed of an opaque material to prevent reflection of external light.

21. The method according to claim 18, wherein reflection of an external light by the signal lines is prevented.

22. A flat panel display comprising:
   an insulating substrate;
   a pixel electrode formed over the insulating substrate;
   an opaque conductive film formed on a front surface of the insulating substrate except at the pixel electrode;
   an insulating film equipped with contact holes exposing a portion of the opaque conductive film; and
   a thin film transistor equipped with a gate electrode, and conductive patterns for source and drain electrodes connected to the opaque conductive film through the contact holes.

23. The flat panel display according to claim 22, wherein the opaque conductive film acts as a black matrix and a power supply line.

24. The flat panel display according to claim 22, wherein the opaque conductive film consists of Mo or Cr as a metallic material having a low reflexibility.

25. The flat panel display according to claim 22, wherein the opaque conductive film has a gradual concentration gradient comprising a first transparent component and a second metallic component, the opaque conductive film acts as a black matrix, and the black matrix comprises a film in which the deeper an incidence depth of an external light is, the more the second metallic component is increased while the more the first transparent component is reduced according to a deposition thickness of the black matrix.

26. The flat panel display according to claim 25, wherein the first transparent component comprises a transparent film comprising one of ITO, IZO and ZnO, and the second metallic component comprises one of Al, Cr, Mo, W, Ti, Ag and Cu.

27. The flat panel display according to claim 22, further comprising a capacitor equipped with a first electrode which consists of the opaque conductive film, a second electrode which consists of the same material as the gate electrode and a third electrode which consists of the conductive patterns, and the first electrode and the third electrode are connected to each other through the contact holes.

28. A flat panel display having thin film transistors and capacitors formed on an insulating substrate comprising:
- a pixel electrode formed on a first portion of the insulating substrate;
- a black matrix formed on a second portion of the insulating substrate and connected to the thin film transistors and capacitors through contact holes to provide power thereto.

29. A flat panel display comprising:
- a transparent insulating substrate;
- source and drain electrodes formed over the transparent insulating substrate;
- a protection film formed over the source and drain electrodes except at a portion defined by a hole;
- a pixel electrode formed over the protection film and contacting the source and drain electrodes through the hole on the protection film; and
- a black matrix formed between a front surface of the transparent insulating substrate and
- a rear surface of the pixel electrode where the pixel electrode contacts the source and drain electrodes.

* * * * *